(12) United States Patent
Soares et al.

(10) Patent No.: US 7,359,281 B2
(45) Date of Patent: Apr. 15, 2008

(54) READ AND/OR WRITE DETECTION SYSTEM FOR AN ASYNCHRONOUS MEMORY ARRAY

(75) Inventors: Marshall A Soares, Taylorsville, UT (US); Paul W. Moody, Sandy, UT (US)

(73) Assignee: IntelliServ, Inc., Provo, UT (US)

( * ) Notice: Subject to any disclaimer, the term of this patent is extended or adjusted under 35 U.S.C. 154(b) by 24 days.

(21) Appl. No.: 11/048,588

(22) Filed: Feb. 1, 2005

(65) Prior Publication Data

US 2006/0171245 A1    Aug. 3, 2006

(51) Int. Cl.
*G11C 8/00* (2006.01)
(52) U.S. Cl. .............................. 365/233.1; 365/189.011; 365/189.07
(58) Field of Classification Search ................ 365/233, 365/189.01, 189.07
See application file for complete search history.

(56) References Cited

U.S. PATENT DOCUMENTS

| | | | |
|---|---|---|---|
| 4,523,110 A | 6/1985 | Johnson | |
| 6,023,430 A | 2/2000 | Izumikawa | ................. 365/194 |
| 6,282,144 B1 | 8/2001 | Batson et al. | ........... 365/230.05 |
| 6,392,957 B1 * | 5/2002 | Shubat et al. | ................ 365/233 |
| 6,822,907 B2 | 11/2004 | Maruyama et al. | |
| 6,822,923 B2 | 11/2004 | Pfeiffer et al. | |
| 2002/0159309 A1 | 10/2002 | Yamanaka | ................... 365/200 |

FOREIGN PATENT DOCUMENTS

| | | |
|---|---|---|
| WO | WO 98/39772 | 9/1998 |
| WO | WO 2005/008672 A3 | 1/2005 |

OTHER PUBLICATIONS

Annex to the European Search Report from corresponding European patent Application No. EP 06 25 0115, dated Jul. 18, 2006, 1 page.

* cited by examiner

*Primary Examiner*—Huan Hoang
(74) *Attorney, Agent, or Firm*—Jeffrey E. Daly

(57) ABSTRACT

This invention provides an asynchronous electronic circuit that has an asynchronous memory circuit where the memory cells are arranged in columns and rows. The asynchronous circuit includes a read completion detection circuit and a write completion detection circuit that determines an end of the read cycle or the write cycle for a word byte of information. Upon completion of the read or write cycle an acknowledge signal is generated from the read completion detection circuit or the write completion detection circuit. The read and/or write acknowledge signal is used as a control signal to advance the electronic circuit to the next subsequent step in a process. The invention further provides a method for detecting the end of a read and/or write cycle issuing an acknowledge signal that may be used to provide control to an asynchronous electronic circuit to advance to the next step in a sequence.

40 Claims, 11 Drawing Sheets

READ AND/OR WRITE DETECTION SYSTEM FOR AN ASYNCHRONOUS MEMORY ARRAY

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Technical Field

This invention relates to asynchronous electronic circuits, in particular, to asynchronous electronic circuits with memory arrays.

2. Background Information

An asynchronous circuit operates to define a particular state defined in terms of the input values to the circuit and in conjunction with the internal actions of the circuit. The asynchronous circuit may be a time domain or a sequence domain type of circuit. The asynchronous circuit may assert a specific signal at the specific occurrence of an event and for a specific duration. Two of the advantages of using asynchronous circuits include power conservation and the lack of a requirement for clock alignment between various stages, thus alleviating the need for global synchronization.

Generally speaking, the greatest power consumption by an asynchronous circuit occurs when the circuit is transitioning from one state to another. A synchronous circuit utilizes a clock cycle, thus the circuit will consume more power because of the continual cycling of circuits, especially during refresh cycles or clock-initiated transitions. In the asynchronous circuit, the greatest power consumption will occur during those transition stages when the circuit changes states. Ideally, the asynchronous circuit will consume less power than the same synchronous circuit. Since clocking circuitry is not used in asynchronous circuits, the elimination of the clock circuit provides a further power savings. This makes the asynchronous circuit ideal for applications where the conservation of battery power is important. Further, the circuit is deemed to be self-timing.

However, asynchronous circuits have been difficult to apply in memory applications, where a clock cycle provides the timing for writing or reading data in memory in a sequential process. Therefore, a need to provide a memory circuit that is capable of holding its state without refreshing the memory cells, but yet providing the timing for a sequential writing or reading of data to a memory cell in an allotted time slot is required. This becomes more complicated where the temperature of the devices may vary or the operating environment of the devices is severe allowing for rapid changes in temperature or where a multitude of devices acting in concert have different operating environments. As one example, downhole telemetry systems used for monitoring and/or controlling oil and gas exploration tools can see extreme temperature variation across the system.

BRIEF SUMMARY

This invention provides an asynchronous electronic circuit having an asynchronous memory circuit that includes memory cells arranged in columns and rows. The asynchronous circuit may include a read completion detection circuit and a write completion detection circuit that determines an end of the read cycle or the write cycle for a word byte of information from or to an associated memory cells. Upon completion of the read or write cycle an acknowledge signal is generated from the read completion detection circuit or the write completion detection circuit. The read and/or write acknowledge signal is used as a control signal to advance the electronic circuit to the next subsequent step in a process. The asynchronous electronic circuit also may include an address register, a column decoder, a row decoder, an input register, an output register, a sense amplifier and a controller for controlling the sequences and instructions between the requesting read and write agent and signals for controlling the read and write operation to the memory array.

The invention also provides a method for detecting the end of the read and/or write cycle. The process includes a write agent sending a request for a write operation to write data to the asynchronous memory array as well as the data and the address to the byte word location in the memory array. The controller may assert a busy signal to the writing agent and sets the combinatorial logic for writing the data to the required memory cells. At the same time, the controller sets a write enable to the circuits. The write enable may be applied to the write completion circuit setting forth a process that is time dependent upon the arrangement of the elements in the write completion detection circuit. The time dependency may be inherent in the circuit and device structure. When the write completion detection circuit finishes the process, the write completion detection circuit issues a write acknowledgement signal to the controller. The controller may issue an acknowledgement signal to the writing agent, the writing agent de-asserting the request to the controller and the controller de-asserting the busy and the acknowledge signal to the writing agent and placing the asynchronous memory circuit in a low power mode to conserve electrical power.

The invention also provides a method for detecting the end of the read cycle. The process includes a read agent that sends a request for a read operation to read data from the asynchronous memory array as well as the address of the byte word location in the memory array. The controller asserts a busy signal to the read agent and sets the combinatorial logic for the memory cells to be read. At the same time the controller sets a read enable signal to the circuits. The bit and bit bar data lines are brought to a low-power logic state. When the column read detector circuits for each of the columns for the required word byte have each been read a read acknowledge signal will be sent to the read agent. The read agent may de-assert the request to the controller in the asynchronous memory circuit and the controller may de-assert the busy and the acknowledge signal to the read agent and places the asynchronous memory circuit in a low power mode to conserve electrical power.

DETAILED DESCRIPTION OF THE DRAWINGS AND THE PRESENTLY PREFERRED EMBODIMENTS

Figure 1:
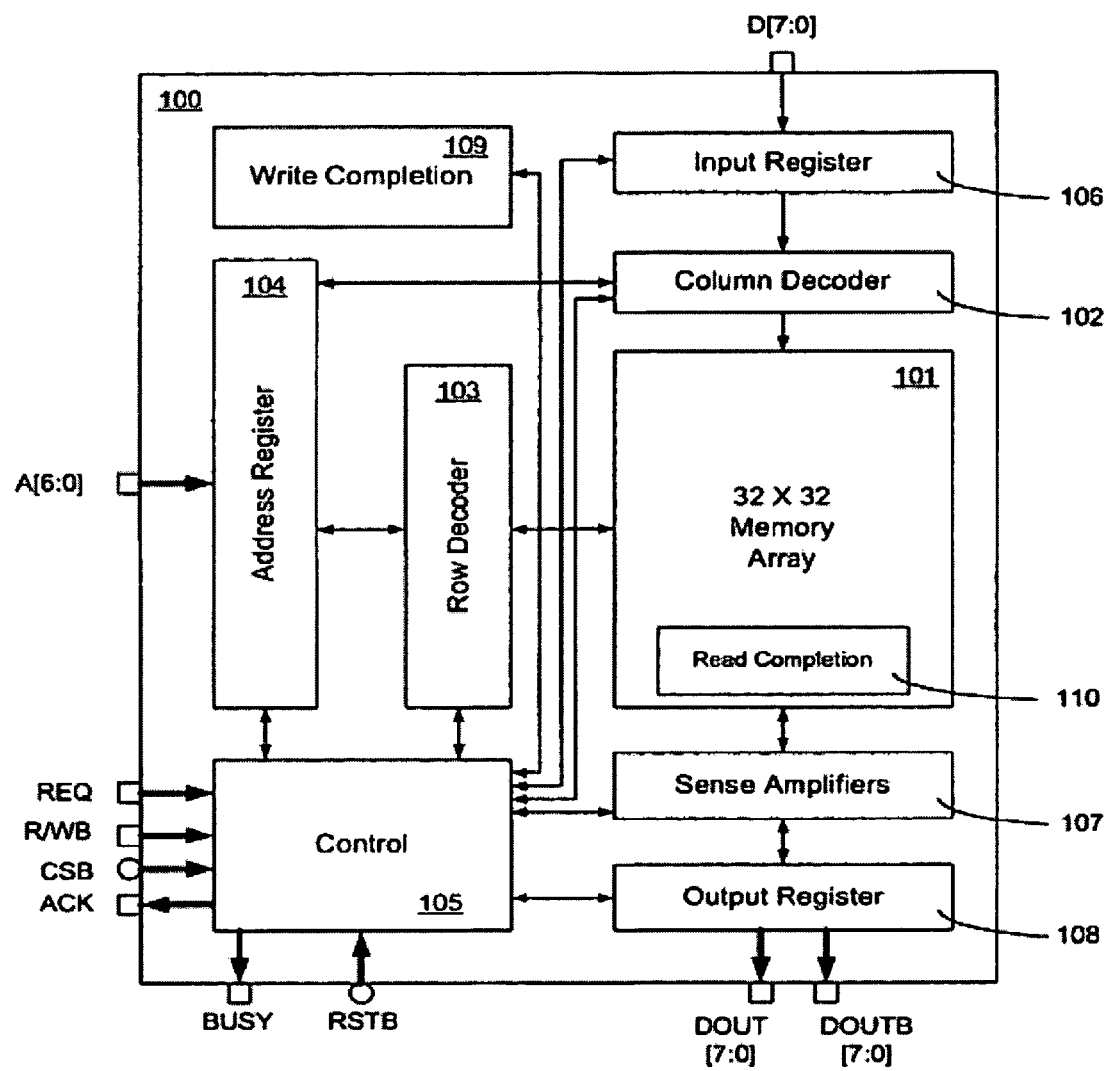
FIG. 1 is a block diagram of an asynchronous memory circuit with read and write completion detection circuits.

The elements that are illustrated in the above figures will be explained in more detail in the following discussion. However, it is noted that the following discussion is exemplary and is not limited to the embodiments that are described. For example, although selected aspects, features or components of the implementations are depicted as stored in program, data, embedded or multipurpose system memories, all or parts of the system and methods consistent with the memory array with read and write detection circuits may be stored on or read from other machine-readable media, for example, embedded memory, secondary storage devices such as hard disks, floppy disks, and CD-ROMs; electromagnetic signals; or other forms of machine readable media either currently known or later developed.

Although this specification describes specific components of a memory array with read and write detection circuits, methods, systems and articles of manufacture consistent with the memory array with read and write detection circuits may include additional or different components. For example, a controller may be implemented as a microprocessor, microcontroller, application specific integrated circuit (ASIC), discrete logic, or a combination of other types of circuits acting as explained above. A communication system may be a private network, private data network or a cellular telephone system and may include the Internet or any future communication system that might provide the communications for data transfer and/or voice including downhole data communication systems used in oil and gas or geothermal exploration or production operations.

An asynchronous memory may be a RAM memory that may be used in applications where power may be limited. Such a circuit is intended to conserve energy and be used only when needed. If used in a synchronous operation, power consumption would be high as the memory would continually be refreshed and a clock signal would continually activate some of the circuits. In an asynchronous operation, the power would be utilized only when data is written to or read from the memory array. Thus, the circuit may attain a sleep mode if there is no request for information. However, without a clock signal to sequence a read or write cycle, the asynchronous memory array would have no way of realizing when the read or write operation was completed. Further, without the clock signal, a triggering signal to advance to the next read or write cycle is absent.

To advance to a next step in an asynchronous circuit, an acknowledge signal is generated signaling the completion of a step or the presence of a desired state. In an asynchronous memory cell, an acknowledge signal may be generated based on the access time of the circuit. The access time may be dependent upon the device temperature and power supply voltage. In applications where downhole equipment monitors drilling operations such as that described in U.S. Pat. No. 6,670,880 B1, the entire disclosure of which is incorporated by reference, the equipment is subjected to severe environmental temperature stresses and varying power supply voltages. Thus, the circuits may have varying access times and power supply voltages due to the stresses of operating in the harsh environment of a drill string. Thus, a read completion detection circuit and a write completion detection circuit that mimics the arrangement of the memory cell in a memory device may provide the triggering signal for the asynchronous memory array to advance to the next step as the circuits are exposed to the same stresses.

An acknowledge signal from the read and write completion detection circuits may provide the triggering or control signal necessary to advance the circuit to the next stage. For example, when a write enable signal is sent to the memory array, the signal is also sent to the write completion detection circuit. The write completion detector circuit may process the signal as a memory cell in the memory array would process the signal, and after the write completion detection circuit simulated the changing of states occurring in a memory cell, the write completion detection circuit may send an acknowledge signal to a controller or requester so that the controller may advance the asynchronous circuit to the next step. If there is no subsequent step in the process, the controller may place the memory array circuit in a "sleep" mode.

A similar sequence of events may occur for a read operation. However, when the read operation is requested, data will be read from a memory cell in the memory array. Prior to the request, the bit signal line and the bit bar signal line may be set to a logic HIGH on both lines for power conservation. The change that occurs on the bit signal line and the bit bar signal line may be sensed in a read completion detector circuit connected to the column of memory cells that includes the targeted memory cell. Upon sensing a change on the signal lines, the read completion detection circuit processes a read acknowledge signal to the controller that the reading of the word byte is complete. The read acknowledge signal may advance the system or circuit to the next cycle or to a "sleep" mode to conserve power.

A block diagram of an asynchronous circuit 100 having an asynchronous memory array with a read detection circuit and a write detection circuit is illustrated in FIG. 1. The memory array 101 may be a random access memory ("RAM") array or flash memory or other semiconductor memory device that may be capable of storing data. The memory array 101 contains the storage elements or cells and byte decoders for storing data. The memory array 101 may be of any dimensional size such as 32×32, 128×8, or a 4×4. The memory array 101 is connected to a column decoder 102 and a row decoder 103. The column decoder 102 and the row decoder are connected to and controlled by the address register 104. The address register 104 is connected to the controller 105 from which the address register 104 receives addresses.

The controller 105 may be connected to outside electronic circuits (not shown) such as processors, communication equipment and other circuits that may require a memory circuit in various applications and may be known as read and/or write agents. The controller 105 interfaces with the external circuits in order to receive and transmit requests, acknowledgements, busy status, data and control signals. The controller 105 may control and sequence the read and write cycle for the asynchronous memory array 101. The controller 105 may operate in an asynchronous mode responding to inputs and instructions from an outside controller or agent. The controller 105 may include embedded programs or may operate as a sequencer, guaranteeing the correct operation by sequentially operating. The controller 106 may also be a state machine or an asynchronous state machine operating with distributed states. Such state machines may use Petri Nets to describe the logical flow of operations.

The input register 106 receives data that may be stored in the memory array 101 from external electronic devices and circuits. The input register 106 is connected to the memory array 101. The memory array 101 is connected to sense amplifiers 107 that may receive data stored in the memory array 101. The sense amplifiers 107 are further connected to the output register 108 where the data is held at the end of a read cycle. The output register may be a series of SR-registers for holding the data once it has been read from the memory array 101.

When the memory array 101 is selected for a write or read operation, a request REQ may be transmitted from outside the asynchronous circuit 100 to the controller 105. A chip select signal CSB may accompany the request REQ. Once the request is made and the chip begins to process a read or write operation a BUSY signal will be output from the controller 105. The controller 105 will allow an address to be input to the Address Register 104 and if the request was a write request, data may be applied to the input register 106. If a read request is made, the output register 108 will be prepared to receive the data from the memory array 101. A read or write operation is selected with a read/write bar ("R/WB") signal. The R/WB may be a logic LOW for a write operation and a logic HIGH for a read operation.

Figure 2:
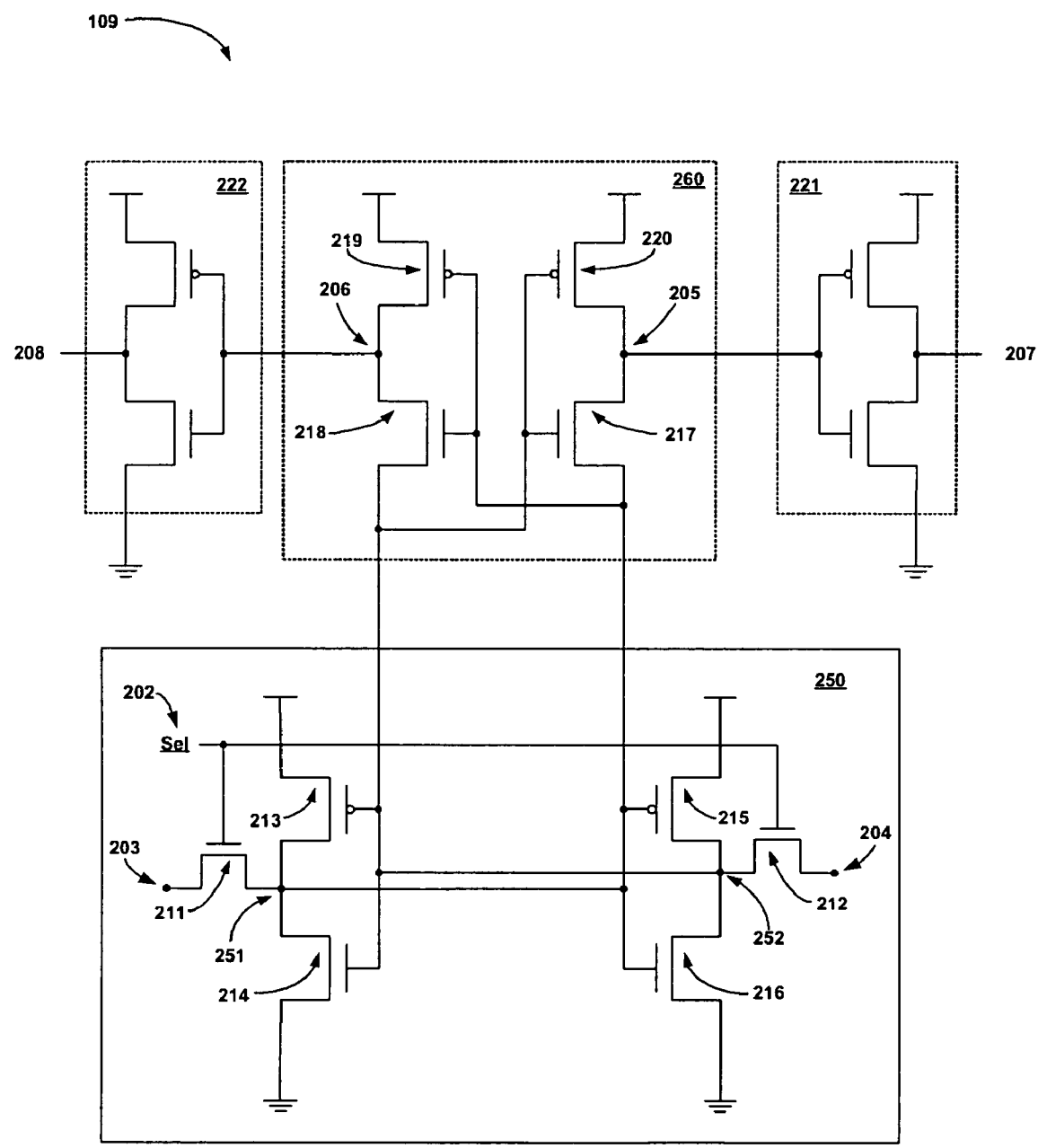
FIG. 2 is a schematic of a write completion detection circuit.

FIG. 2 shows an embodiment of a write completion detection circuit. The circuit 109 is comprised of two sections with the first section being or mimicking a memory cell 250 to which data will be written, and the second section of the detection circuit 109 as a sensing amplifier 260 that is connected to the output of the memory cell section 250. The write completion detection circuit will develop a write acknowledge signal when the write operation to a memory cell in the memory array 101 is complete.

In one embodiment, the write enable signal may be applied to three inputs 202, 203 and 204 of the write completion detector circuit 109. The first input simulates an address select signal input 202. The second signal is the data line signal input otherwise known as a bit signal input 203. The bit signal input 203 may reflect the stored value of the memory cell. The third input is the inverse data line or the bit bar data signal input 204. The bit bar value has the inverse value of the bit signal.

The address select signal input 202 is connected to the gates of transistors 211 and 212. The drain or source of transistor 211 connects to the bit signal input 203. The drain or source of transistor 211 is connected to the drain of transistor 213 and the drain of transistor 214 and the gates of transistors 215 and 216. The source or drain of transistor 212 is connected to the bit bar signal input 204. The source or drain of transistor 212 is connected to the drain of transistor 215, the drain of transistor 216 and the gates of transistors 213 and 214. The source of transistor 213 is connected to the supply voltage and the source of transistor 214 is connected to an electrical common point or ground. The source of transistor 215 is connected to the supply voltage and the source of transistor 216 is connected to an electrical common point or ground. In this embodiment, the transistors 213 and 215 are PMOS transistors and transistors 211, 212, 214, and 216 are NMOS transistors.

The drain or source of transistor 211 may be connected to the amplifier 260. In a preferred embodiment, the drain or source of transistor 211 may be connected to the source of transistor 217 and the gates of transistors 218 and 219. The drain or source of transistor 212 is also connected to the sensing amplifier, specifically to the source of transistor 218 and the gates of transistors 217 and 220. In a preferred embodiment, transistors 219 and 220 may be PMOS transistors and transistors 217 and 218 may be NMOS.

The outputs 205 and 206 of the sensing amplifier 202 may be applied to inverters 221 and 222, respectively. The respective outputs 207 and 208 of the inverters 221 and 222 may be applied in a logic circuit (not shown in FIG. 2) to form the write acknowledge signal.

Figure 3:
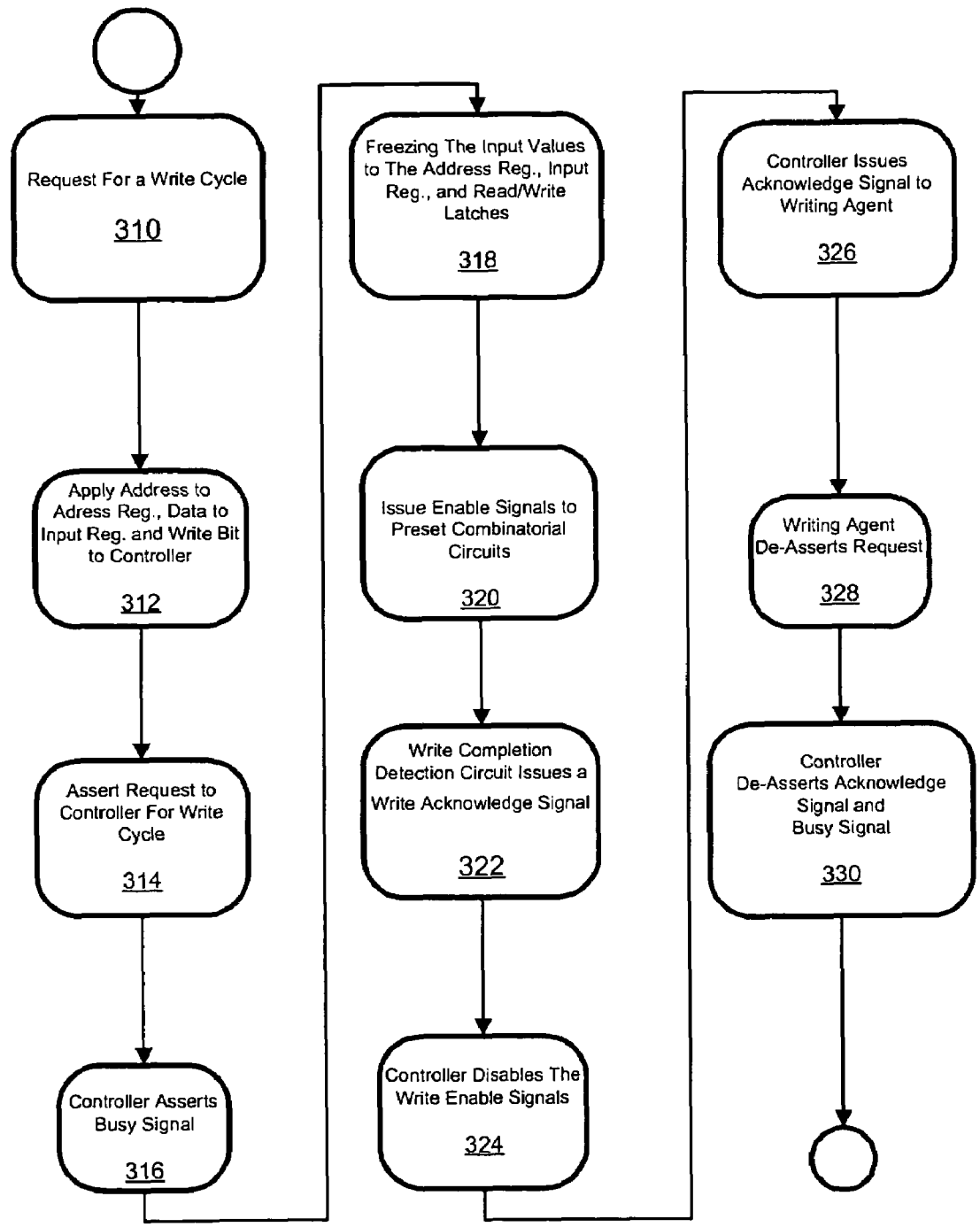
FIG. 3 is a flow diagram of the write completion process.

FIG. 3 is a flow diagram of an embodiment of the process of the write cycle. The triggering event for the asynchronous circuit 100 to enter the write cycle is the reception (step 310) of a request signal. Internally, a full sequence of events will follow the request so that a word byte is written into the memory array 101. In one embodiment, all of the events may be controlled by and self-timed by the controller 105. The sequence may begin with an outside writing agent (not shown) setting up the inputs. The writing agent may be a processor or controller in a system or communication system that shares the asynchronous memory 100 or it may be a controller in another system.

The writing agent will apply (step 312) the targeted word byte address A[6:0] to the address register 104 and the data to D[7:0] of the input register 106. The writing agent may set the R/WB signal to the controller 105 as a logic LOW for a write signal. At this point, the writing agent may assert (step 314) the request to the controller 105. The request signal may be a logic HIGH. In response to the request, the controller may assert (step 316) the busy status signal BUSY in response to the request as a HIGH signal. The controller then stops (step 318) the transparent operation of the address, data, and read/write latches, freezing the input values until the write operation is completed. Internally, the LG signal (not shown) may be de-asserted by going to a LOW state.

Next, the controller may issue (step 320) the enable signals to preset the memory or RAM combinatorial circuits. These enables are timed to occur after all data and address changes have rippled through the decoder, avoiding false glitches and overlapping edges which will waste power. A general power-down (PD=high) signal is issued to disconnect the bit (B) and bit bar (BB) lines for the selected column only. The bit and bit bar lines may go to a logic HIGH. A write-specific power-down signal (WPD=high) may be issued to disconnect the sense amplifiers. While these amplifiers draw no current when bit and bit bar are pulled HIGH, they would waste current during a write.

The write operation is completed in the targeted memory cell of the memory array 101, while simultaneously a write completion detection circuit 109 processes the completion of the word byte write cycle. The controller 105 issues (step 320) the write enables to the write completion detection circuit 109, the row decoders 103, and the column drivers 104. The row decoder 103 enables the appropriate row in the memory RAM array row signal. In the preferred embodiment, the memory RAM row signal may be a logic HIGH for the enabled row.

The column drivers enable the appropriate column bit and bit bar signal lines for the data. The column drivers also issue a column enable to the selected column. In a preferred embodiment, the enable signal may be a logic LOW for the enabled column. The column enable signal and the row enable signal are used to generate the word byte selection ("BYTESEL") in the RAM array. The extra decoding that is distributed in the array may avoid a write disturb in the array and may decrease power during a write cycle.

The write completion detection circuit 109 processes the write enable signal. During the process, an inherent time delay of the circuit and the devices mimic the process that is being performed in a memory cell as the write cycle proceeds in the memory array 101. Upon completion of the simulation of the write process in the write completion detection circuit 109, the detection circuit 109 issues (step 322) the write acknowledge signal when the simulation of the write cycle is complete. The write acknowledge signal may be a two-phase asynchronous signal with each transition, high or low, and is considered the acknowledgement signal. The two phase handshaking protocol includes a request (one transition) and an acknowledge signal (one transition). The operation of the write completion detection circuit 109 is described later in detail.

The controller 105 disables (step 324) the write enable signals in response to the write acknowledgement from the write completion detection circuit 109. The disabling of the write enable signals is a way for the controller 105 to deselect the memory array locations by removing the signals from the address register 104, the column decoder 102 and the input register 106. The memory array 101 returns to the lowest power state again.

The controller then issues (step 326) an acknowledge signal to the writing agent. In a preferred embodiment, the acknowledge signal may be a logic HIGH. Upon receipt, the writing agent will then de-assert (step 328) the request to the controller 105 in the asynchronous circuit 100. In the preferred embodiment, the request signal returns to a logic LOW. The controller 105 responds to the LOW signal of the request by de-asserting (step 330) the acknowledge signal and the busy signal. In the preferred embodiment, the acknowledge signal and busy signal also return to a logic LOW. Steps 328 and 330 are optional and may only be required if the device is implementing a four phase timed-operation. A four-phase handshaking protocol includes the steps of a request (one transition), an acknowledge (one transition), a request(one transition with a return to the original logic level), and an acknowledge (one transition with a return to the original logic level). In a two phase implementation, these steps (328 and 330) may not be necessary. Since the preferred embodiment of the circuit does not implement timing, the steps may not be included. The steps are presented here for completeness.

Figure 4:
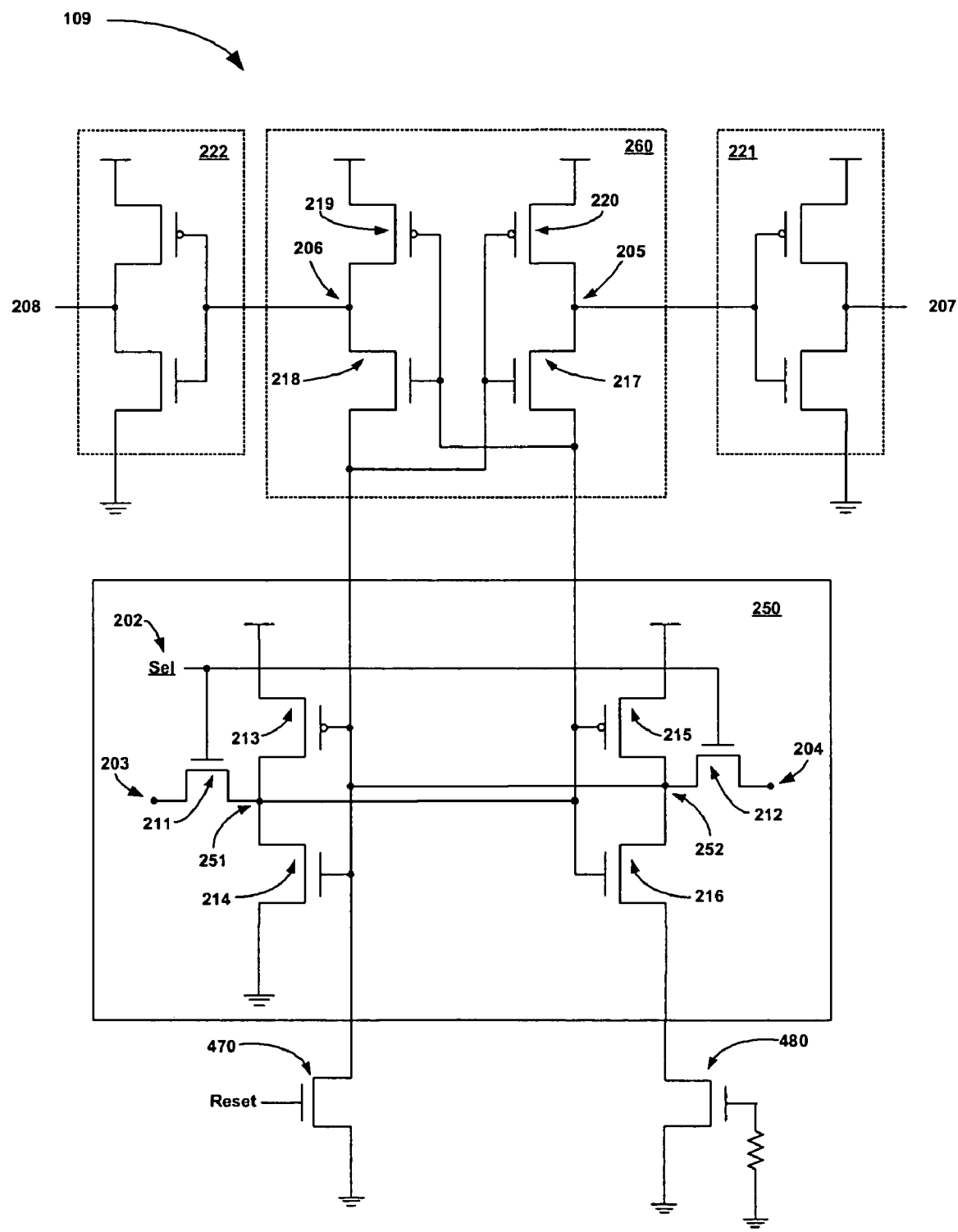
FIG. 4 is a schematic of a write completion detection circuit with a reset circuit.
Figure 5:
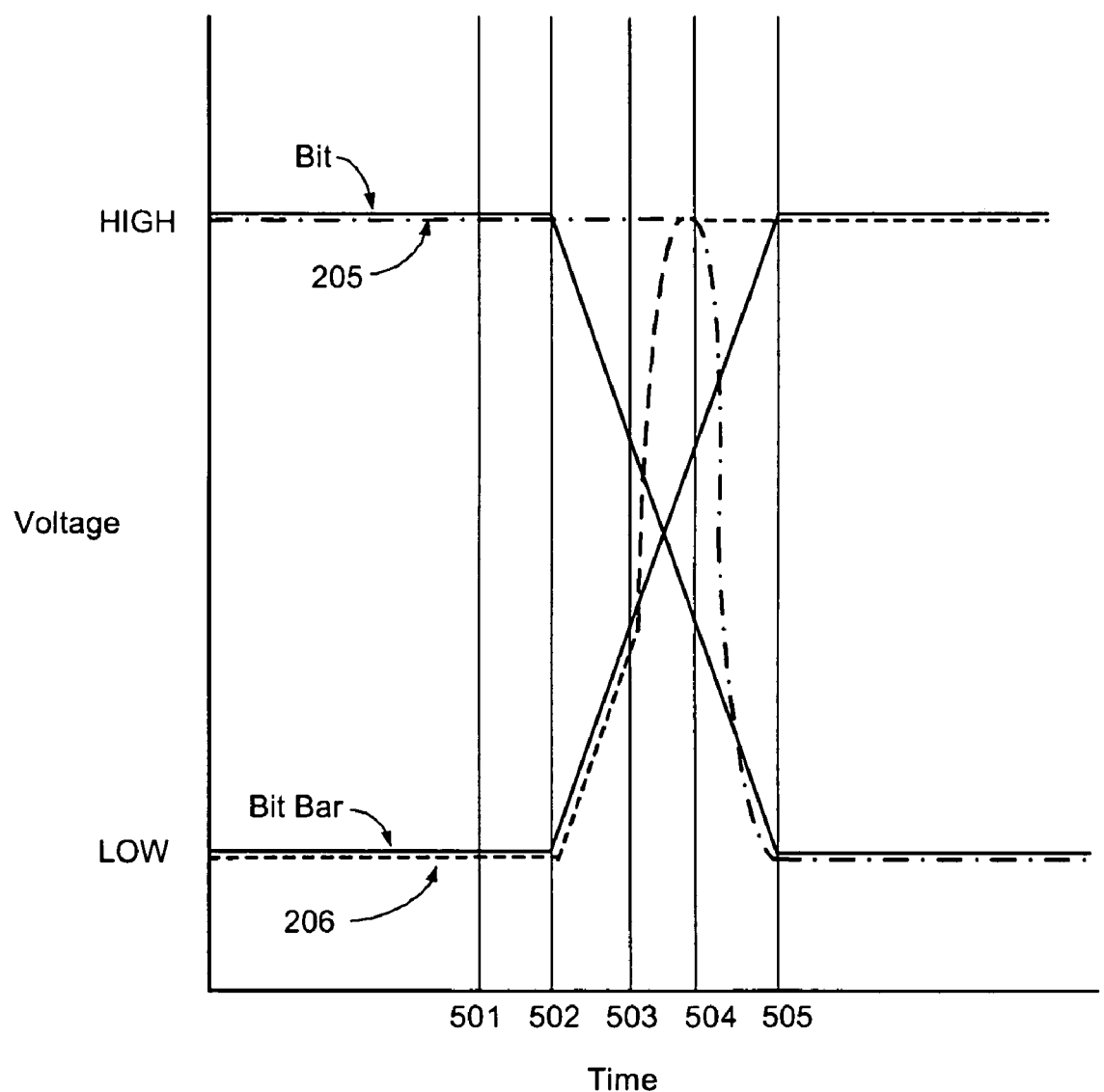
FIG. 5 is a timing diagram of the write completion detection circuit.

FIG. 4 shows an embodiment of the write completion detection circuit 109. Upon an initial use of the asynchronous memory circuit, a reset signal may be required to set the write completion detection circuit for a proper operation. In the embodiment of FIG. 4, an initial reset using transistor 470 sets the write completion detection circuit so that a logic HIGH signal is set at output 205 and a logic LOW at output 206. FIG. 5 is a timeline diagram of the switching that will occur in this circuit when a write enable is applied to the circuit 109. The state of output 205 and 206 is shown at timeline 501. Q 251 is a logic HIGH and Q Bar 252 is a logic LOW (timeline 501). The value of Q 251 is referred to as Bit on FIG. 5 because Bit is the signal voltage at the terminal of Q 251 in FIG. 4 that drives the change in state of the circuit and is illustrated in FIG. 5. Bit bar is the signal voltage measured at the terminal of Q bar 252 in FIG. 4 that also drives the change in state of the circuit and is illustrated in FIG. 5.

When the signals are applied to the input of the write completion detection circuit 109, there will not be an immediate change in the state of the sensing section 260. For example, the output is a logic LOW at the output 206 and a logic HIGH at the output 205. When signals are applied to the gate of the devices, electric charges on the gate of the devices begin to shift as well as the flow of current through the devices. The signals may cycle through the circuit with varying switching times due to variation in the charges on the elements caused by variations in temperature and power supply voltages. These memory asynchronous circuits 100 may operate in hostile environments. The hostile environments may include low temperatures of about −100C. to high temperatures of about 250C., and receive power from batteries that may vary in voltage values, 3.3 to 5.5 volts. The asynchronous circuits 100 may be used in downhole applications for drilling or production for oil and gas or geothermal wells and be installed in the drilling pipes that are made up into a drill string. In this environment, the asynchronous circuits are subjected to extremely low and very high temperatures as well as high vibrational shock, and are expected to monitor and communicate relevant data to the surface under these circumstances.

Figure 6:
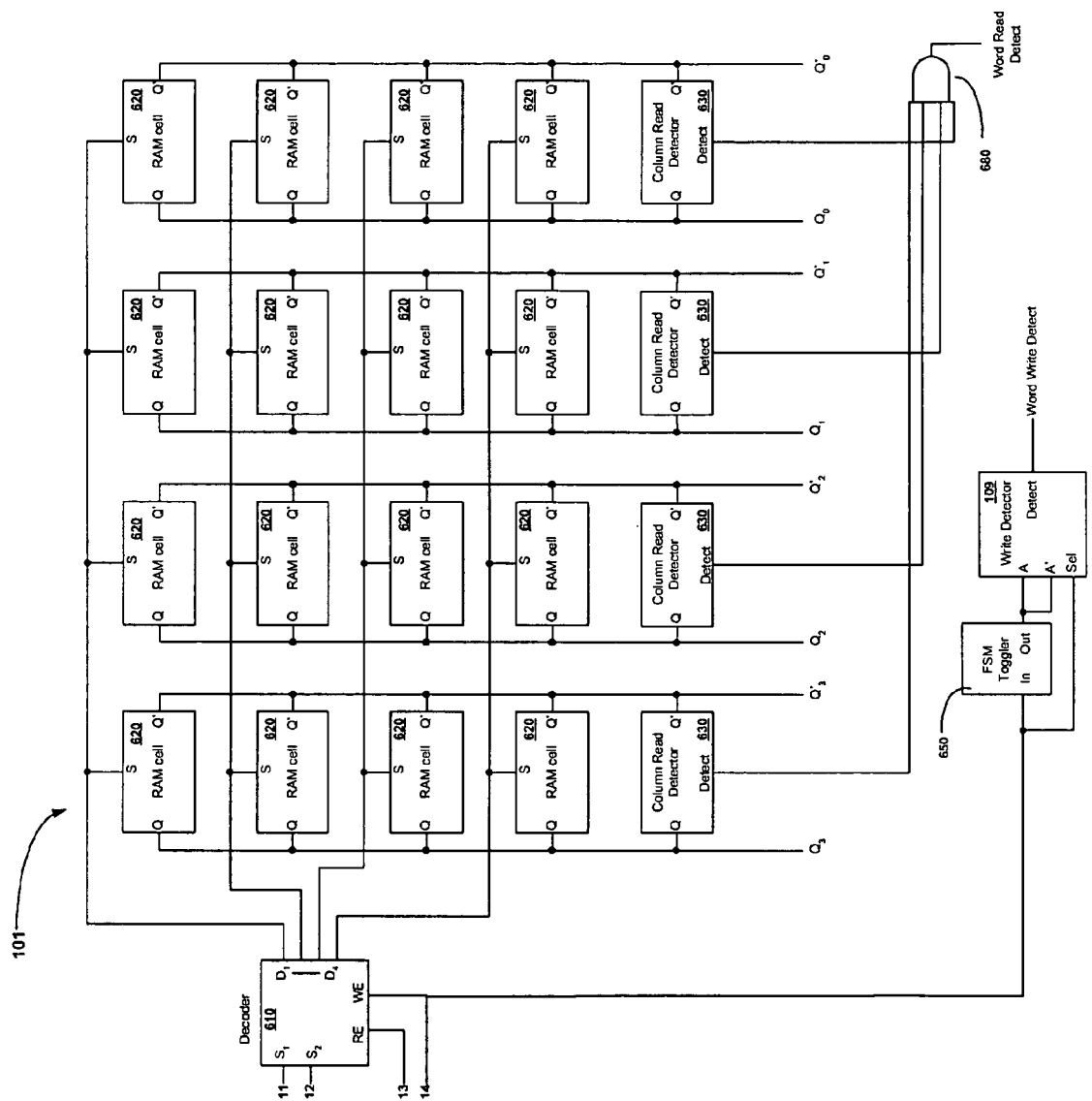
FIG. 6 is a block diagram of a memory array with a read completion detection circuit and a write completion detection circuit.

FIG. 6 is a block diagram of the memory array 101. A decoder 610 for the rows and columns is connected to the rows and columns of memory cells. The decoder connects to a FSM toggler 650 and processes the write enable signal for the write completion detector circuit 109. The write enable signal may be processed so that it is applied to the three inputs 202, 203 and 204 of the write completion detection circuit 109 at approximately the same time the write enable signal arrives at the memory cells in the memory array 101. These input signals 202, 203 and 204 may simulate the identical condition for the memory cells making up the word byte in the memory array 101. When the processed write enable signal is applied to the write completion detection circuit 109, the address select signal 202 will be driven high, activating transistors 211 and 212. Transistor 211 will be switched ON allowing the bit input signal 203, a logic LOW (for this example) to be applied eventually to the gates of transistors 215 and 216, 218, and 219. The LOW value of signal draws the charge from Q 251 from the previously HIGH value towards the LOW value of Bit 203. Transistor 212 will also be switched to the ON-state and a HIGH signal from the bit bar signal input 204 eventually will be applied to the gates of transistors 213 and 214 217 and 220. The opposite effect of Q 251 is occurring at Q bar 252 as the carriers from the HIGH signal are trying to raise the previous LOW logic state. The change in the voltages is reflected in FIG. 5 (timeline 502).

Until a threshold voltage for transistor 217 is crossed, the output 205 will remain at a logic HIGH as illustrated in FIG. 5 (timeline 502 and 503). In addition, the gradually decreasing bit signal voltage at the gate of transistor 218 will cross a threshold voltage deactivating or turning OFF transistor 218. Transistors 217 and 219 are NMOS transistors and will not change state at the same time upon application of the gate signals.

As the value of the bit signal 203 rises, the voltage at output 206 begins to rise because transistor 218 is still in the ON-state and output 206 tracks the bit bar signal voltage. Between timeline 502 and 503, transistor 218 remains in the ON-state because the voltage from bit has not yet dropped below the threshold voltage to turn OFF transistor 218. The voltage level at output 206 maintains the tracking the signal of bit bar 204 as it rises, until the voltage on the gate drops reaching threshold for transistor 218 (time 503). At that point the output 206 is subject to the activation of transistor 219.

In the meantime, the voltage on the gate of transistor 217 will continue to rise and when the voltage reaches the threshold voltage will reach the ON state (time 504). The resulting activation of transistor 217 drains the voltage at output 205 resulting in a logic LOW (time 505). When the voltage at output 205 finally reaches a logic LOW level, the switch-over is complete for at least one bit in the word and the output is applied to the exclusive-or gate 237. The exclusive-or gate 237 will issue a write detect signal to the controller 105.

The time delay for the switch-over is the pseudo-hysteresis of the state change of the circuit. The circuit tends to stay in the same state until there is a final push that causes the circuit to change states. Here, the NMOS transistor 217 does not reach the ON state, and will not, until the voltage on the gate rises above the threshold voltage. Thus, there is a time delay resulting from the NMOS transistor threshold voltage values.

The threshold value is not necessarily at a value that is half-way between the common voltage point and the supply voltage, but resides at a value that is dictated by the physical properties of the semiconductor material. The threshold value is dictated by properties such as the carrier concentration levels in the material of the designated conduction channel and in the materials in proximity of the conduction channel. It may be possible to change the material characteristics and the value of the threshold voltages during manufacture to control the value of the threshold voltage for operation. Further, the carrier concentration levels are very much dictated by the temperature of the semiconductor. Higher temperatures result in the generation of more carriers in the electronic material. Temperature will also play a role in the value of the threshold voltage. As the temperature changes, the threshold voltage may be adversely effected.

The asynchronous circuit 100 that works in harsh temperature extremes may take advantage of the change in the temperature dependency of the pseudo-hysteresis time delay. As the environmental temperature changes, the effect equally impacts the memory cells in the memory array and the word completion detection circuit simultaneously. As the temperature rises, the time for switching the output state also increases because the threshold voltage decreases. The pseudo-hysteresis effects may be felt equally by both circuits. Therefore, the temperature dependency for the circuit self-compensates. The write completion detector circuit 109 should accurately track the time of a write cycle. In order to take advantage of the similarities, the write completion detection circuit 109 may include a layout of the memory cell from the memory array 101.

FIG. 6 is an embodiment of a read completion detection circuit 110 connected into a memory array 101 or RAM array. The circuit includes a series of column read detectors 630, one column read detector 630 for each column in the memory array 101. Each column read detector 630 may be connected to the associated column of memory cells 620 via the data signal line of bit, and the opposite signal line of bit bar. Each column read detector 630 is further connected to a logic circuit 680 that conditions and forms the read acknowledge signal when the particular memory cells 620 in each column corresponding to the targeted word byte has been read. The read acknowledge signal is also known as the word read detect signal and indicates that the byte of data has been read from the memory array 101.

Figure 7:
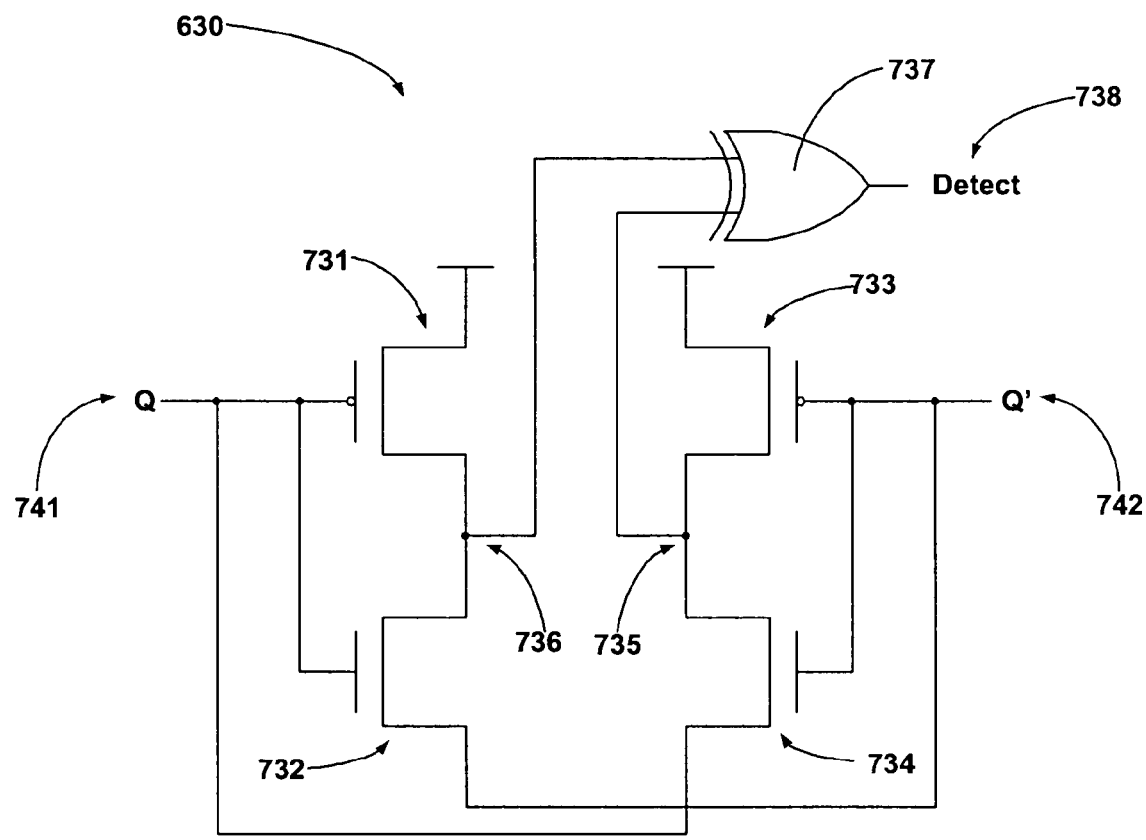
FIG. 7 is a read cell circuit.

FIG. 7 is an embodiment of a column read detector circuit 630 or read cell circuit that is connected to a column of memory cells 620 in a memory array 101. The column read detector may be a sense amplifier. The detector circuit 630 includes a first transistor 731, a second transistor 732, a third transistor 733 and a fourth transistor 734. In a preferred embodiment, the first transistor 731 and the third transistor 733 are PMOS transistors and the second transistor 732 and the fourth transistor 734 are NMOS transistors. The first transistor 731 and the second transistor 732 form a first inverter circuit and the third transistor 733 and the fourth transistor 734 form a second inverter circuit. The inverter circuits are paired and cross-coupled.

The source for the first transistor 731 connects to a power supply, the drain connects to the drain of the second transistor 732, and the gate connects to the bit data signal line Q 741. The bit data signal line Q 741 also is connected to the gate of the second transistor 732, and the source of the second transistor 732 connects to the bit bar data line Q' 742. The source of the third transistor 733 connects to the power supply, the drain of the third transistor 733 connects to the drain of the fourth transistor 734, and the gate of the third transistor connects to the bit bar data line Q' 742. The bit bar data line Q' 742 further connects to a gate of the fourth transistor 734. The source of the fourth transistor 734 connects to the bit data line Q 741. The transistors 731, 732, 733, and 734 form the previously mentioned cross-coupled inverters.

The output of the cross-coupled inverters 735 and 736 may be directed to an exclusive-or gate 737. When a read cycle for a memory cell in the column has been sensed, the output 735 will be either a logic HIGH or a logic LOW. The output 736 for the other inverter will be of the opposite value because of the cross-coupling. The output of the exclusive-or circuit 737 may connect to an AND gate 780. When the inputs of the AND-gate all attain a logic HIGH, the output of the AND-gate will then become a logic HIGH indicating that the read cycle has been completed forming the read acknowledge signal that will be directed to the controller 105.

Figure 8:
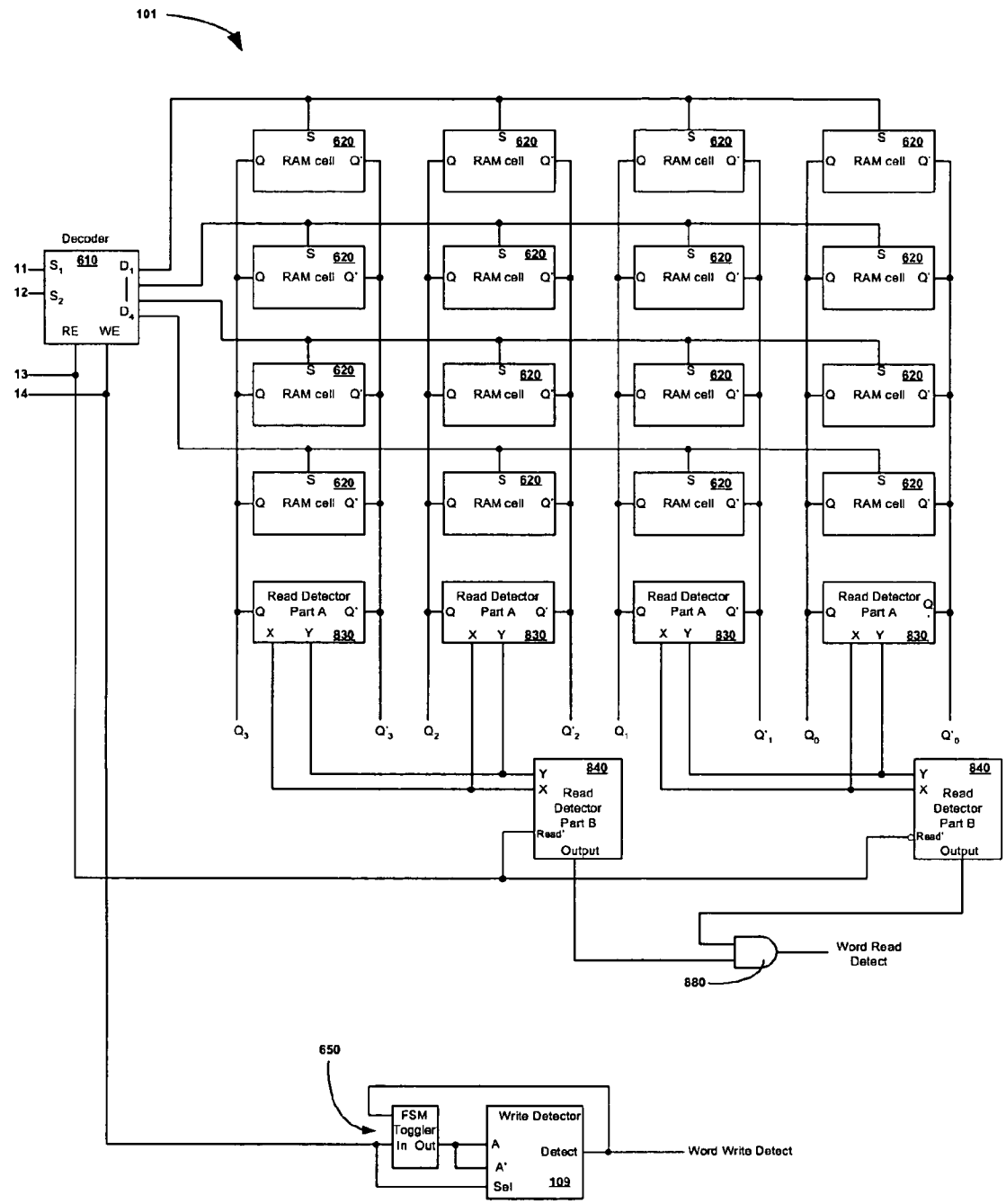
FIG. 8 is a block diagram of a memory array with a read completion detection circuit (Part A and Part B).

FIG. 8 is another arrangement of the sense amplifier or read completion detector circuit 110 connected to a memory array 101 of memory cells 620. The read completion detector circuit 110 may be divided into two parts, Part A 830 and Part B 840. The arrangement of Part A 830 is similar to that described for the read column read detector 830 in FIG. 7. Part B 840 is modified to accept the output of column read detectors from more than one column, process the signal and direct the output to an AND-gate 880. The combination of Part B 840 and the AND-gate 880 form a read detector logic circuit.

Figure 9:
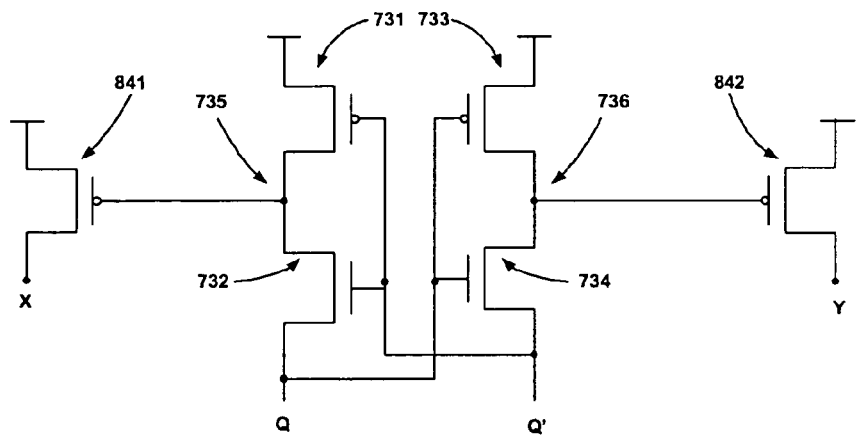
FIG. 9 is a schematic of a read completion detection circuit (Part A).

Part A 830 of the read completion detector circuit 110 is shown in FIG. 9. Part A 630 may be the same sense amplifier as described for the column read detector circuit 630 with the addition of two PMOS transistors 841 and 842. The gate of the transistor 841 connects to the output 735 of one of the cross-coupled inverters. The source of the transistor 841 is connected to the power supply and the drain connects to an input X of Part B 840 of the read completion detector circuit 109. The gate of transistor 842 connects to the output 736 of the other cross-coupled inverter. The source of the transistor 842 is connected to the power supply and the drain of transistor 842 connects to the other input on Part B 840.

Figure 10:
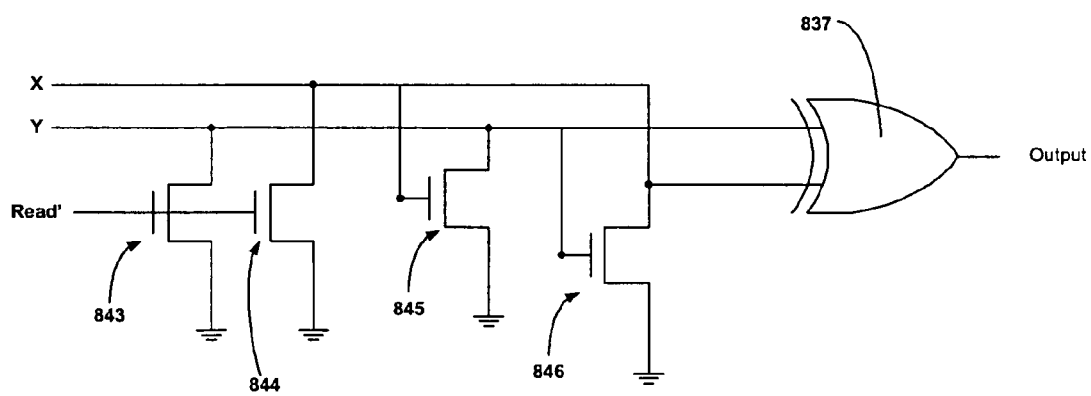
FIG. 10 is a schematic of a read completion detection circuit (Part B).

Part B 840 of the read completion detector circuit is shown in FIG. 10. Part B 840 is formed from transistors 843, 844, 845 and 846 and an exclusive-OR gate 837. Read' is connected to the gates of both transistors 843 and 844. The drain of transistor 843 and the drain for transistor 844 are connected to the Y and X inputs respectively. The Y and X inputs are further connected to the gate of transistor 845 and the gate of transistor 846, respectively, and to the source of transistor drain and the drain of transistor 845, respectively. The sources of transistors 843, 844, 845 and 846 are connected to an electrical common point or ground.

When the read enable signal is disabled, the output of the exclusive-or gate 837 will not indicate that the column or columns of memory cells 620, represented by the exclusive-or circuit 837 have been read. Additionally, when the read enable signal is disabled, the input signal Read' is a logic HIGH activating both transistors 843 and 844, thus allowing the ground potential to be applied to the inputs of the exclusive-or circuit 837. Thus, the output of the exclusive-or gate 837 is a logic LOW. When read enable is active, input Read' becomes a logic LOW allowing the inputs X and Y to become active.

When Part A 830 senses that a memory cell 620 has been read, by way of example, one of the outputs 735 may be a logic LOW and the other output 736 may become a logic HIGH. These values will drive transistor 841 to output a logic HIGH for output X and transistor 842 to output a logic LOW for output Y. The HIGH signal on output X will be applied to an input of the exclusive-or logic circuit and to the gate of transistor 845. Transistor 845 will be activated, locking in the value of the exclusive-or circuit 837 by placing a potential that is representative of a logic LOW on the other input to the exclusive-or circuit. The input is tied to output Y which is also a logic LOW signal when a HIGH is applied to the X output. Part B 840 only allows for one memory cell to be read from the combination of the two columns. Therefore, only one bit of data from the memory cells 620 making up the two columns may be used to form the requested word byte of data.

Referring to FIG. 8, just prior to a read enable signal, the memory array 101 may be in a predefined condition or sleep mode to conserve power resources. The pair of signal lines, bit and bit bar, are at a logic level HIGH when no read operation is being performed on the memory array 101. The bit and bit bar signal lines will remain in this condition until the column of memory cells are enabled for a read cycle and the column is enabled. At the time of the reading, the memory cell 620 in the row that was enabled will cause a shift or draw down in the voltage level of one of the bit or bit bar signal lines toward a logic LOW level.

The draw down in the voltage value will be sensed at the sense amplifier 107 which will amplify the value and store the value of the memory 620 in the output register 108. The change in value also will be sensed at the column read detector circuit 630 (a sense amplifier) that is connected to the column of memory cells. The change in value on the bit signal line or the bit bar signal line is an occurrence of a read operation in a memory cell.

Figure 11:
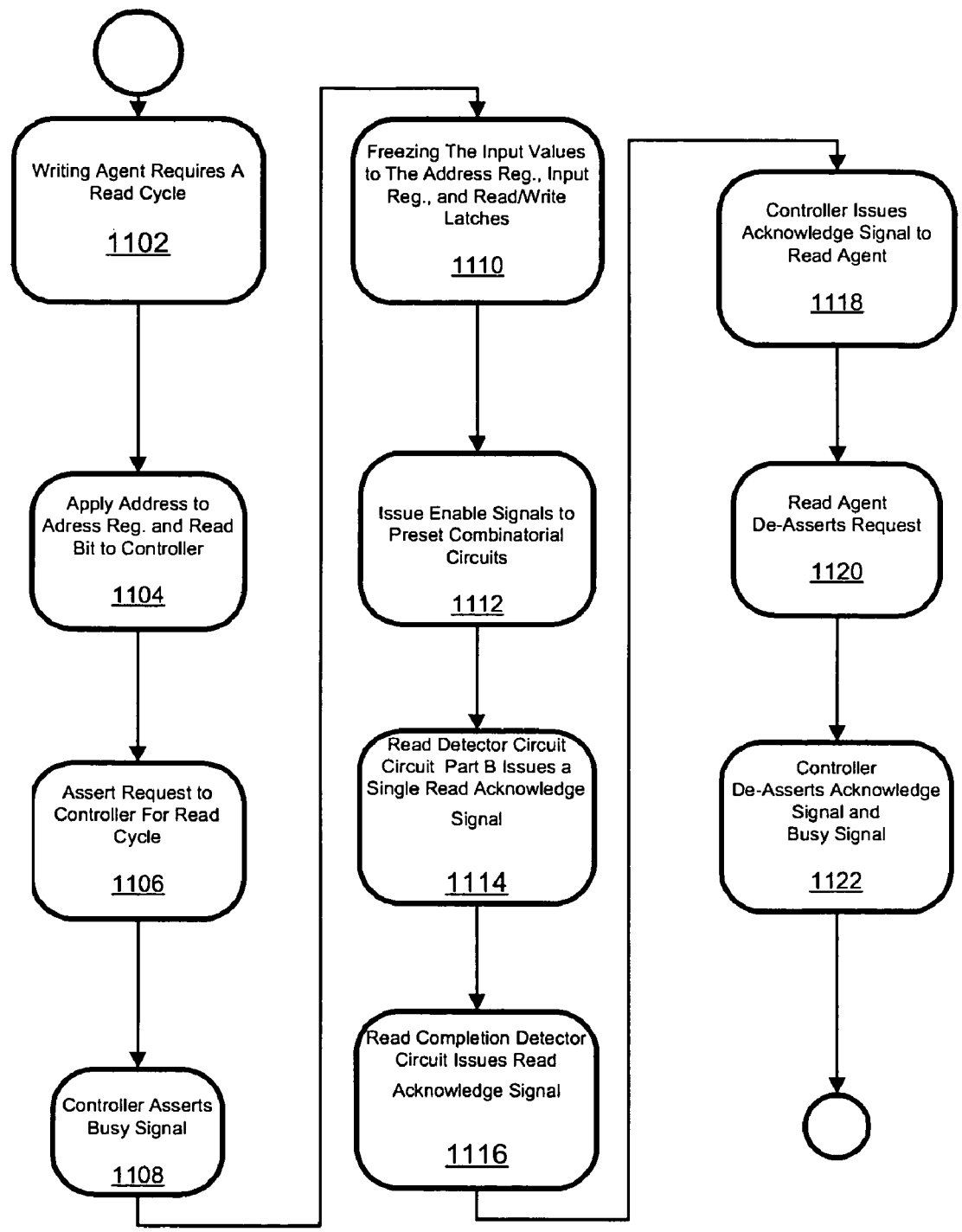
FIG. 11 is a flow diagram for a read cycle.

Internal to the asynchronous memory array 100, a full sequence of events will occur for reading a byte of data from the RAM. FIG. 11 is a flow diagram of the process for reading a word byte of information from the memory array 101. These events may be controlled by and self-timed by an internal controller.

The sequence begins when a reading agent (not shown) requires (step 1102) a read cycle and initiates (step 1104) the input to the address register 104, A[6:0] and by setting the Read/Write Bit ("R/WB") to a logic HIGH. The reading agent also may assert (step 1106) a request ("REQ") to the controller 105 by setting REQ to a logic HIGH. In response to the request, the controller asserts (step 1108) a busy status signal ("BUSY") to the reading agent. The reading agent may be the same device that asserted the write request that was previously described. The reading agent also may be a controller that has ultimate control for the asynchronous memory device 100, a controller in another system, or a controller in a communication system.

Once the controller 105 asserts the busy status signal (step 1108), then the controller 105 stops the transparent operation of the address and read/write latches by freezing (step 1110) the input values. Internally, the signal LG is de-asserted and becomes a logic LOW.

The controller 105 next issues (step 1112) the read enable signals to preset the RAM combinatorial circuits, the row decoders 103 and the column decoders 102. The read enables are timed to occur after all data and address changes have rippled through the entire decoder scheme, avoiding false glitches and overlapping edges that may waste power. When the memory cell 620 in a particular column is decoded and selected and the bit bar and the bit signals lines are no longer tied to a logic HIGH, meaning that the memory element is selected, the value of the selected memory element will pull down either the bit or bit bar signal line for the column to a logic LOW. This action may reflect the value stored in the memory cell 620. The sense amplifier generates a byte of pseudo-dynamic developed-data (bit data ("BD[7:0]") and bit bar data ("BBD[7:0]")). These signals set or reset the output SR latches. The output latch 108 may be designed in parallel with the column read detection circuit 630 or Part A 830 of the read completion detection circuit 110. This sequence may generate (step 1114) a single read acknowledge signal when the data from the memory cell 620 is safely stored in the output latches 108. When one single read signal is generated (step 1114) from Part B of the Read Detector 840, the signal is fed to a Word Read Detect Circuit 880 that generates (step 1116) the read completion detection acknowledgement to the controller 105 when all of the column read detection circuit Part B 840 have sensed the read cycle for the appropriate columns.

The controller 105 will issue (step 1118) the external acknowledge signal to the reading agent. The reading agent in reply may de-assert (step 1120) the request for the read operation. The controller 105 responds to this request by de-asserting (step 1122) the acknowledge signal. At the same time, the controller 105 also may de-assert (step 1122) the busy signal. Steps 1120 and 1122 are optional and may only be required if the device is implementing a four phase operation. In a two phase implementation, the steps may not be necessary. Since the preferred embodiment of the circuit does not implement timing, the steps may not be included and are presented here for completeness.

Figure 12:
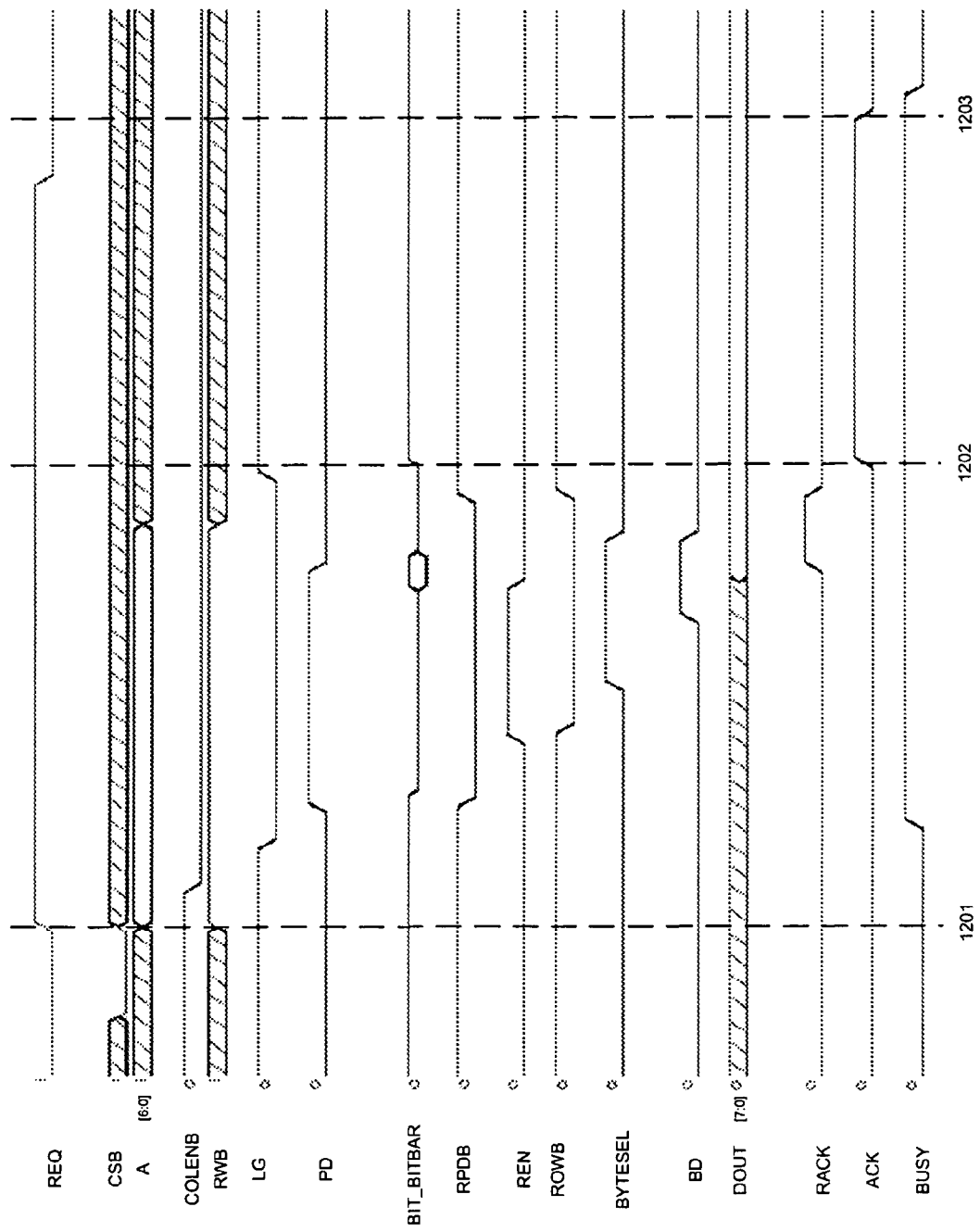
FIG. 12 is a timing diagram for the read cycle.

FIG. 12 is a timing diagram for the read operation. The entire operation takes place between the positive edge of the request signal (timeline 1201) and the positive edge of the acknowledge signal (timeline 1202) in the two phase handshaking routine. The sequence may require a significant amount of time in order to ensure that the read sequence through all of the columns that hold the requested word byte has been completed before the acknowledge signal is generated. If the read operation is a four phase operation, then the read completion detection cycle may be extended further (timeline 1203).

It is therefore intended that the foregoing detailed description be regarded as illustrative rather than limiting, and that it be understood that it is the following claims, including all equivalents, that are intended to define the spirit and scope of this invention.

We claim:

1. An asynchronous electronic circuit comprising:
a memory array having memory cells to store data, the memory cells arranged in a plurality of columns and a plurality of rows;
a read completion detection circuit that determines an end of a read cycle where data from the memory cells in the memory array is read and sends a read acknowledge signal upon completion of a read cycle; and
a write completion detection circuit that determines an end of a write cycle where data to the memory cells is written and sends a write acknowledge signal upon completion of a write cycle, wherein each column of memory cells in the plurality of columns is connected in parallel to the read completion detector circuit, the read completion detection circuit sensing a change on at least one of a bit signal line and a bit bar signal line.

2. The asynchronous electronic circuit of claim 1, wherein the read acknowledge signal is a control signal to advance the electronic circuit to a subsequent step.

3. The asynchronous electronic circuit of claim 1, wherein the read completion detector further comprises column read detectors and logic circuitry, outputs of the column read detectors are connected to the logic circuitry, the logic circuitry determines that a word byte of data has been read from the memory array.

4. The asynchronous electronic circuit of claim 3, wherein the column read detector farther comprises a pair of cross-coupled inverters.

5. The asynchronous electronic circuit of claim 3, wherein the logic circuit further comprises a plurality of exclusive-or logic circuits, each exclusive-or logic circuit connected to the outputs of the column read detectors in a subset of the plurality of columns that form a bit of data in the word byte of data, the exclusive-or logic circuit reading one column in the subset of the plurality of columns and an output of the exclusive-or circuit is applied to an input of an AND gate that develops the read acknowledge signal.

6. The asynchronous electronic circuit of claim 1, wherein the asynchronous circuit is used in a downhole drilling environment.

7. The asynchronous electronic circuit of claim 1, wherein the asynchronous circuit is used in a temperature range of about −100° C. to about 250° C.

8. The asynchronous electronic circuit of claim 1, further comprising a controller to issue a read enable, a write enable, a busy, an acknowledge signal to a read and/or write agent and for receiving a read and/or write request.

9. An asynchronous electronic circuit comprising:
a memory array having memory cells to store data, the memory cells arranged in a plurality of columns and a plurality of rows;
a read completion detection circuit that determines an end of a read cycle where data from the memory cells in the memory array is read and sends a read acknowledge signal upon completion of a read cycle; and
a write completion detection circuit that determines an end of a write cycle where data to the memory cells is written and sends a write acknowledge signal upon completion of a write cycle, wherein the write completion detector circuit receives a write enable signal for writing a digital value to the memory cell, the write completion detector circuit processes the write enable signal based on an inherent switching signal delay in the write completion detection circuit and outputs the write acknowledge signal.

10. The asynchronous electronic circuit of claim 9, wherein the write acknowledge signal is a control signal to advance the electronic circuit to a subsequent step.

11. The asynchronous electronic circuit of claim 9, wherein the inherent switching signal delay is based on a pseudo-hysteresis effect of changing the output state of the write completion detection circuit.

12. The asynchronous electronic circuit of claim 11, wherein the pseudo-hysteresis effect between the memory cell and the write completion detection circuit is temperature dependent and is about the same value.

13. The asynchronous electronic circuit of claim 12, wherein the pseudo-hysteresis effect is power supply dependent.

14. The asynchronous electronic circuit of claim 9, wherein the write completion detection circuit further comprises a transistor arrangement that forms a circuit configuration for the memory cell.

15. The asynchronous electronic circuit of claim 9, wherein the write completion detection circuit changes state each time the write enable signal to the memory cell is detected.

16. An asynchronous electronic circuit comprising:
a memory array having memory cells to store data, the memory cells arranged in a plurality of columns and a plurality of rows; and
a read completion detection circuit having a column read detector circuit connected to a bit signal line and a bit bar signal line in each column of the plurality of columns of the memory array, the read completion detection circuit determines an end of a read cycle where a word byte of data is read from the memory cells and transmits a read acknowledge signal upon determination of a read cycle completion wherein the read acknowledge signal is a control signal to advance the electronic circuit to a subsequent step.

17. The asynchronous electronic circuit of claim 16, wherein the read completion detection circuit further comprises a cross-coupled pair of inverters.

18. The asynchronous electronic circuit of claim 17, wherein the read completion detection circuit further comprises a read detector logic circuit connected to each column read detector circuit, the read detector logic circuit processes the read acknowledgement signal when the logic detector circuit determines that all of the columns comprising the word byte have been read.

19. The asynchronous electronic circuit of claim 17 wherein the read completion detection circuit further comprises at least one exclusive-or circuit and an AND circuit.

20. The asynchronous electronic circuit of claim 16, wherein the read completion detection circuit further comprises:
a first transistor with a source connected to a power supply, a drain connected to a drain of a second transistor, a gate operably connected to a bit data line, the bit data line operably connected to a gate of the second transistor, and a source of the second transistor connected to a bit bar data line; and
a third transistor with a source connected to the power supply, a drain connected to a drain of a fourth transistor, a gate operably connected to the bit bar data line, the bit bar data line operably connected to a gate of the fourth transistor and a source of the fourth transistor connected to the bit data line.

21. The asynchronous electronic circuit of claim 20, wherein the first transistor and the third transistor are PMOS transistors and the second and third transistors are NMOS transistors.

22. The asynchronous electronic circuit of claim 20, wherein the read completion detection circuit further comprises the drain of the first transistor connecting to a first input of a logic gate and the drain of the third transistor connecting to a second input of the logic gate.

23. An asynchronous electronic circuit comprising:
a memory array having memory cells to store data, the memory cells arranged in a plurality of columns and a plurality of rows;
a write completion detection circuit that receives a write enable signal, processes the write enable signal based on a switching time delay in a circuitry of the write completion detection circuit to determine an end of a write cycle where data is written to a memory cell in the memory array, and sends a write acknowledge signal upon completion of a write cycle, wherein the time delay in the write detection completion circuit is a pseudo-hysteresis effect of changing an output state in the write completion detection circuit.

24. The asynchronous electronic circuit of claim 23, wherein the write acknowledge signal is a control signal to advance the electronic circuit to a subsequent step.

25. The asynchronous electronic circuit of claim 23, wherein the write completion detection circuit includes a transistor arrangement that forms the memory cell.

26. The asynchronous electronic circuit of claim 23, wherein the write detection circuit further comprises:
a first transistor having a source that connects to a source voltage, a drain on the first transistor that connects to a drain of a second transistor, and a gate on the first transistor that connects to a gate on the second transistor, a drain on a third transistor, a drain on a fourth transistor and a bit signal; and
the third transistor having a source that connects to the source voltage, a drain on the third transistor that connects to a drain of the fourth transistor and a gate on the third transistor that connects to a drain on the fourth transistor, a drain on the second transistor, and a bit bar signal.

27. The asynchronous electronic circuit of claim 26, wherein the first and third transistors are PMOS transistors and the second and fourth transistors are NMOS transistors.

28. The asynchronous electronic circuit of claim 26, wherein the write completion detection circuit further comprises:
a fifth transistor with a source connected to a source voltage, a drain of the fifth transistor connected to a drain of a sixth transistor forming a first signal output and a gate of the fifth transistor connected to the drain of the first transistor, the drain of the second transistor, and a gate of the sixth transistor, the source of the sixth transistor connected to the gate of a seventh transistor and a gate of an eight transistor; and
the seventh transistor with a source connected to a source voltage, a drain of the seventh transistor connected to a drain of the eighth transistor forming a second signal output and the gate of the seventh transistor connected to a gate of the eight transistor and the source of the sixth transistor, the source of the eighth transistor connected to the gate of the fifth transistor and the gate of the sixth transistor.

29. The asynchronous electronic circuit of claim 28, wherein the fifth and seventh transistors are PMOS transistors and the sixth and eighth transistors are NMOS transistors.

30. The asynchronous electronic circuit of claim 23, wherein the pseudo-hysteresis effect between the memory cell circuit and the write completion detection circuit is temperature dependent and about the same value.

31. The asynchronous electronic circuit of claim 30, wherein the pseudo-hysteresis effect is power supply dependent.

32. A method for detecting an end of a read cycle for reading a word byte in an asynchronous memory array comprising the following steps of:
sending a request for the read cycle to the memory array;
sensing an occurrence of a read operation from a column in a plurality of columns of memory cells in the memory array with a read completion detection circuit;
processing a plurality of occurrences of read operations in the read completion detection circuit; and
issuing a read acknowledge signal from the read completion detection circuit upon completion of the processing step, wherein the processing step further comprises:
developing a data signal and an inverse data signal from the occurrence of the read cycle; and
applying the data signal to a first inverter circuit and the inverse data signal to a second inverter circuit wherein the first inverter circuit and the second inverter circuit form a pair of cross-coupled inverters that develop the read acknowledge signal.

33. The method of claim 32, wherein the step of sending further comprises the steps of:
setting up an input to the asynchronous memory array for the read cycle;
asserting a request for the read cycle; and
issuing enable signals to preset a RAM combinatorial circuit.

34. The method of claim 32, wherein sensing further comprises detecting a value from the column in the plurality of columns that represents a stored value in a memory cell.

35. The method of claim 32, further comprising the step of disabling the read request upon receipt of the acknowledge signal.

36. A method for detecting an end of a write cycle in an asynchronous memory device comprising the following steps of:
sending a request for the write cycle to the memory circuit;
sensing an occurrence of the write cycle in a memory array with a write completion detector circuit;
processing the write cycle in the write detection circuit; and
issuing a write acknowledge signal from the write detection circuit upon completion of the processing step, and using a time delay in changing output states in the write completion detection circuit to determine an end of a write cycle after receiving a write enable signal, wherein the time delay of the write completion detection circuit is a pseudo-hysteresis delay in changing states based on the value of threshold voltages of transistors in the write completion detection circuits.

37. The method of claim 36, wherein sending further comprises the steps of:
setting up an input to the asynchronous memory array for the write cycle;
asserting a request for the write cycle; and
issuing at least one enable signal to preset a RAM combinatorial circuit and to a write completion detection circuit.

38. The method of claim 36, wherein processing further comprises:
receiving a write enable signal in the write completion detection circuit that comprises a circuit formed as a memory cell in the memory array wherein the output of the circuit formed as the memory cell is an input to cross-coupled inverters that form the write acknowledge signal; and issuing the write acknowledge signal from the write completion detection circuit.

39. The method of claim 36, further comprising the step of disabling the write enable signals in response to the write acknowledgement, wherein the write acknowledgement is a two-phase asynchronous signal with a transition to high or to low, the transition being the write acknowledgement signal.

40. The method of claim 36, wherein the RAM combinatorial circuit develops a SET signal, a first data signal and a second data signal from the request for the write cycle to be applied to the write detection circuit.

* * * * *